April 28, 1970 W. P. LOCKSHAW 3,509,374

DOUBLE POLE ELECTRONIC SWITCHING CIRCUIT

Filed May 1, 1967

WILLIAM PAUL LOCKSHAW
INVENTOR.

BY

ATTORNEY

United States Patent Office 3,509,374
Patented Apr. 28, 1970

3,509,374

DOUBLE POLE ELECTRONIC SWITCHING CIRCUIT

William P. Lockshaw, Canoga Park, Calif., assignor to International Telephone and Telegraph Corporation, New York, N.Y., a corporation of Maryland Filed May 1, 1967, Ser. No. 635,195
Int. Cl. H03k *17/00, 17/60*
U.S. Cl. 307—239 5 Claims

ABSTRACT OF THE DISCLOSURE

A gating system utilizing two epoxy potted field effect transistors of the junction type, each transistor being in series with a separate input to a differential amplifier, and means for supplying a gating pulse to both transistors simultaneously, whereby gating spikes transmitted by the transistors due to the high dielectric constant of the epoxy cancel out each other in the differential amplifier.

This invention relates to the electronic switching art, and more particularly to a highly efficient, yet inexpensive gating circuit.

BACKGROUND OF THE INVENTION

The device of the present invention will have a scope of application much broader than that disclosed herein. For example, the invention may be used for gating in almost any kind of circuit. Thus, the invention is not to be limited to the uses therefore specifically disclosed herein.

Notwithstanding the foregoing, the invention has been found to possess exceptional utility in gating circuits utilizing certain types of field effect transistors. Hereinafter, a field effect transistor is referred to as an FET.

In the past an FET of the junction type has been potted in an epoxy which surrounds the entire body of the device and also surrounds and contacts the leads to the device. As is well known, a junction type FET has three leads, namely a source, a drain, and a gate.

All references to FET's herein are references to FET's of the junction type which operate exclusively in the depletion mode.

An epoxy potted junction type FET has an extremely high cutoff resistance as compared to its conduction resistance. Such an FET would therefore make an ideal electronic switch of a high quality were it not for some of its disadvantages to be described. Still further, epoxy potted junction type FET's require no collector voltage supply either at cut off or at saturation as the transistor always does. Thus, FET's draw practically no power at cutoff and very little during receipt of a gating pulse. Still further, the absence of a source or drain supply voltage makes it unnecessary to balance the signal to be gated or the compensate for the offset voltage that is created by the usual collector supply voltage of a transistor. Still further, epoxy potted junction type FET's are very inexpensive. They currently may be purchased for as little as fifty cents apiece.

Conventional epoxy jotted junction type FET's have had limited use to the present time. They have never been used as electronic switches and especially at small signal levels. This is true because the epoxy potting compound has a relatively high dielectric constant. Thus, the leading and trailing edges of a rectangular pulse applied to the FET gate create gating spikes or pulses which are bypassed from the gate to the drain and interfere with the signal sought to be gated. This condition persists because the high dielectric constant of the epoxy increases the interelectrode capacitance. The gate and drain leads with the epoxy thus act as a capacitor or radio frequency shunt for the signals of high frequencies which make up the gating spikes.

SUMMARY OF THE INVENTION

In accordance with the device of the present invention, the above-described and other disadvantages of the prior art are overcome by providing a double pole electronic switch or gate with a differential amplifier. This makes it possible to use an epoxy potted junction type FET in series with each input lead to the differential amplifier because the gating spikes which are injected by the FET's cancel each other out in the amplifier. Further, if a second differential amplifier is employed at the input to the FET's, the FET's cannot inject the gating spikes backward in the system toward the signal source. Still further, either one of both of the amplifiers can amplify the signal to be gated out and cancel the gating spikes at the same time.

The above-described and other advantages of the device of the present invention will be better understood from the following description when considered in connection with the accompanying drawing.

BRIEF DESCRIPTION OF THE DRAWING

In the drawing which is to be regarded as merely illustrative.

Figures 1, 2:
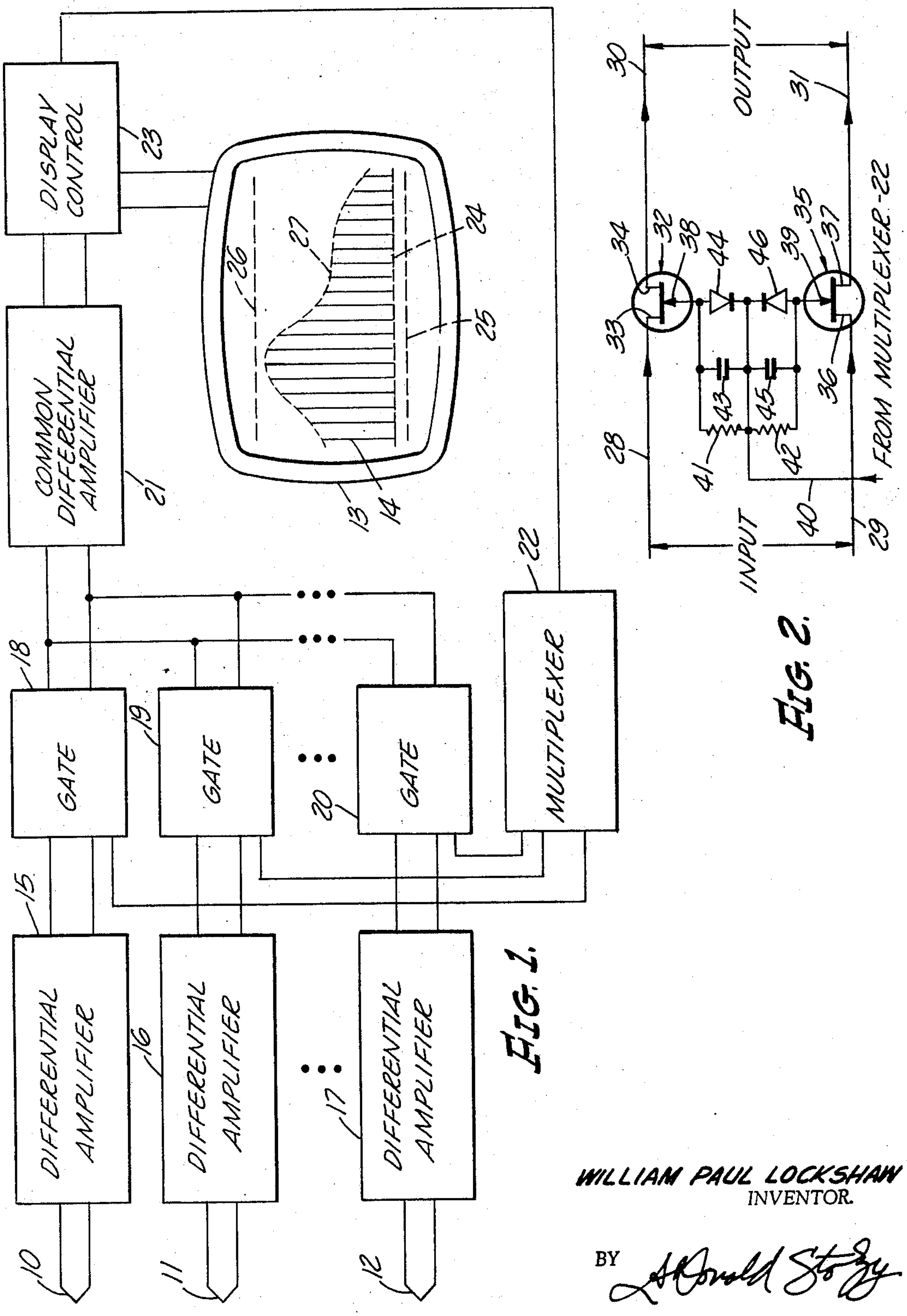
FIG. 1 is a block diagram of one embodiment of the present invention.
FIG. 2 is a schematic diagram of a type of gate which is employed in the block diagram of FIG. 1.

Although the device of the present invention may have a great many applications other than the application disclosed herein, the invention disclosed in FIG. 1 is a monitoring system for a chemical or plastic molding process. Thermocouples are indicated at 10, 11, and 12. Any number of thermocouples may be provided. For example, as many as sixty temperatures may be displayed on a single cathode-ray tube screen as indicated at 13. Each temperature displayed is representative of a temperature of one thermocouple. A temperature is indicated by the length of a vertical illuminated line 14 on screen 13.

Differential amplifiers 15, 16, and 17 are connected, respectively, from thermocouples 10, 11, and 12. Gates 18, 19, and 20 are connected, respectively, from amplifiers 15, 16, and 17. The outputs of gates 18, 19, and 20 are connected to a common differential amplifier 21. A multiplexer 22 is employed to operate gates 18, 19, and 20 one at a time. Display control 23 is connected from multiplexer 22 and amplifier 21 to the cathode-ray tube. Amplifiers 15, 16, 17, and 21 may be conventional. Thermocouples 10, 11, and 12 may also be conventional. Multiplexer and display control 23 may also be conventional. The cathode-ray tube may likewise be conventional. None of the gates 18, 19, and 20 is conventional. Neither is the combination of the blocks shown in FIG. 1.

In the operation of the system shown in FIG. 1, each thermocouple produces a difference of potential which is amplified by a corresponding one of amplifiers 15, 16, and 17. The gates 18, 19, and 20 are opened in succession by multiplexer 22. The order in which the gates are opened is then cyclically repeated. For example, gate 18 is opened. Gate 18 is then closed. Gate 19 is opened. Gate 19 is then closed. Gate 20 is opened. Gate 20 is then closed. Gate 18 is then opened again. The cyclic operation of the gates is then continued so long as the system is in operation.

Display control 23 has a horizontal sweep generator which produces a staircase voltage synchronously with the operation of multiplexer 22. This establishes a cathode ray position at the horizontal position of each line 14.

At the end of the top step of the staircase, the sweep generator is reset and begins the staircase over again starting with the bottom step. The staircase is then continuously repeated during the operation of the system. A vertical sweep is provided during each step of the horizontal sweep. The cathode ray is gated on a period of time only during a portion of the vertical sweep from a base line 24 to a height proportional to the amplitude of the input to display control 23 from amplifier 21. The vertical sweep may start at a line 25 and terminate at a line 26. Vertical lines 14 then have a "profile" 27 from which it can be terminated whether or not the process in progress is proceeding satisfactorily.

Each of the gates 18, 19, and 20 are identical. Only one such gate is therefore described in detail in FIG. 2.

The gate shown in FIG. 2 has input leads 28 and 29 and output leads 30 and 31. An FET (field effect transistor) 32 is provided having a source 33 connected to input lead 28, and a drain 34 connected to output lead 30. FET 35 has a source 36 connected to input lead 29, and a drain 37 connected to output lead 31. FET 32 has a gate 38, and FET 35 has a gate 39. Input lead 40 from multiplexer 22 is connected to gates 38 and 39 through resistors 41 and 42 respectively. A capacitor 43 and a diode 44 are connected in parallel with resistor 41. A capacitor 45 and a diode 46 are connected in parallel with resistor 42. FET 32 and FET 35 have a construction such that a positive pulse applied to gates 38 and 39 will cause the source to drain resistance of each corresponding FET to be very low. Diodes 44 and 46 minimize the transmission of spikes at the termination of agitating pulse received from multiplexer 22.

Many conventional junction type FET's have electrical symmetry. That is, either source or drain may act as the input electrode. The electrical result is the same. If the drain is connected to the input, the source is connected to the output. FET's 32 and 35 may have such electrical symmetry, but such symmetry is not critical or even necessary. Furthermore, in such a case the terms "source" and "drain" can be used simply to indicate functionally where the input and output are connected, respectively, and not the structural or electrical characteristics of the electrodes to which these terms are applied.

The FET's 32 and 35 shown in FIG. 2 have n-type conductivity regions embedded in a p-type substrate. The gate is therefore connected to the n-type material and, as stated previously, requires a positive pulse to lower the substrate resistance. However, the invention may, of course, be operated with both of the FET's 32 and 35 having an opposite conductivity type where a negative gating pulse is supplied.

The device of the present invention may be used in many applications other than the one disclosed herein. Further, the invention is obviously not limited to the gating of a temperature analog. However, there are many applications for the invention in gating temperature analog voltages. For example, one or more temperature analogs are frequently gated for a timed shared indication of jet engine temperatures during ground tests or during in flight tests. In flight recording of jet engine and air foil temperatures are also often performed continuously during any commercial use of an airplane as an aid to crash investigation. Such recording is done by the use of a sharp stylus scratching the surface of a metal tape to make a hopefully indestructible record.

Thus, the system shown in FIG. 1 may be used without display 23 and the cathode-ray tube. The output of amplifier 21 may be connected directly to a recording voltmeter calibrated in temperature, if desired. The voltmeter may be entirely conventional and operate an ink stylus on a moving paper tape or roll. Alternatively, the sharp stylus and the metal tape mentioned above may be employed.

In accordance with the foregoing it will be appreciated that the device of the present invention provides means by which an inexpensive epoxy potted, junction type FET may be employed as a high quality electronic switch. It is true that gating spikes are created by the application of gating pulses to FET's 32 and 35 because the epoxy increases interelectrode capacitance. However, these gating spikes cancel each other out in the common differential amplifier 21. Further, amplifiers 15, 16, and 17 prevent the injection of gating spikes toward the signal sources at thermocouples 10, 11, and 12 or any gating spike reflections therefrom. Still further, amplifiers 10, 11, 12, and 21 all act to amplify the signal sought and, at the same time, aid in gating spike cancellation.

Although only one specific embodiment of the invention has been disclosed herein, many changes and modifications thereof will, of course, suggest themselves to those skilled in the art. The invention is therefore not to be limited to the specific form of the embodiment described or illustrated, the true scope of the invention being defined only in the appended claims.

What is claimed is:

1. In a gating device, the combination comprising: two input leads and two output leads; a first electronic switch connected between one input lead and one output lead; a second electronic switch connected between the other input lead and the other output lead, each of said switches having a control electrode circuit, each of said switches being a field effect transistor, said control electrode of each switch being a gate for each corresponding transistor, said first switch having a source connected to said one input lead and a drain connected to said one output lead, said second switch having a source connected to said other input lead and a drain connected to said other output lead, said switches being potted in an epoxy material having a dielectric constant greater than air, said material being disposed around the body of said switches and around and in contact with the leads thereto, said field effect transistors being both of the junction type, said circuit means including a resistor connected to each of said gates, and a capacitor and a diode connected in parallel with each said resistor, each said transistors being of the same conductivity type, and adapted to present a low resistance to a signal appearing on a corresponding input lead in response to a gating pulse of a predetermined polarity applied to its corresponding gate through said circuit means, each said diodes being poled in a direction to be back-biased by a gating pulse of said predetermined polarity; means for impressing a gating pulse on each control electrode simultaneously; and a differential amplifier connected from said output leads, whereby gating spikes transmitted by said switches cancel out each other in said differential amplifier.

2. In a system for cyclically producing an analog difference voltage proportional to the temperature of each of a plurality of thermocouples in succession, said system comprising: a gating device for each thermocouple; first circuit means including two input leads connecting each said thermocouple to each gating device; a pair of output leads from each gating device; a first electronic switch connected between one of each pair of input leads to a corresponding one of each pair of output leads, a second electronic switch connected from the other input lead of each pair to the other output lead of each pair, each of said first and second switches having a control electrode; circuit means including a multiplexer for impressing a gating pulse on both switches of one gating device simultaneously, said multiplexer supplying a gating pulse to each said gating device in succession repeatedly in a predetermined order; and a common differential amplifier having two input leads, one of said common differential amplifier input leads being connected to said one output lead of each said gating device, the other of said common differential amplifier input leads being connected to said other output lead of each said gating device, whereby gating spikes transmitted by said switches cancel out each other in said common differential amplifier.

3. The invention as defined in claim 2, wherein all of said switches are housed in a dielectric material having a dielectric constant greater than air.

4. The invention as defined in claim 2, wherein each of said switches is a field effect transistor of the junction type, said control electrode of each switch being a gate for each corresponding transistor, said first switch of each gating device having a source connected to one corresponding input lead and a drain connected to one corresponding output lead, said second switch of each gating device having a source connected to the other corresponding input lead and a drain connected to the other corresponding output lead, all of said switches being potted in an epoxy material having a dielectric constant greater than air, said material being disposed around the body of said switches and around and in contact with the leads thereto, said circuit means including a different corresponding resistor connected from said multiplexer to each of said gates, and a capacitor and a diode connected in parallel with each said resistor, the diodes for each gating device being poled in the same direction relative to each corresponding gate, each said transistor of each gating device being of the same conductivity type and adapted to present a low resistance to a signal appearing on a corresponding input lead in response to a gating pulse of a predetermined polarity applied to its corresponding gate through said circuit means, each said diode being poled in a direction to be back-biased by a gating pulse of said predetermined polarity.

5. The invention as defined in claim 4, wherein said first circuit means includes an individual differential amplifier connected from each said thermocouple to each corresponding gating device.

References Cited

UNITED STATES PATENTS 3,375,457 3/1968 Hollstein.

JOHN S. HEYMAN, Primary Examiner

B. P. DAVIS, Assistant Examiner

U.S. Cl. X.R.

307—243, 251, 304